United States Patent [19]
Lederer et al.

[11] Patent Number: 5,177,668
[45] Date of Patent: Jan. 5, 1993

[54] ARRANGEMENT OF AN INTEGRATED CIRCUIT ON A CIRCUIT BOARD

[75] Inventors: Armin Lederer, Schwarzenbruck; Jurgen Zimmermann, Rosstal, both of Fed. Rep. of Germany

[73] Assignee: Diehl GmbH & Co., Fed. Rep. of Germany

[21] Appl. No.: 885,922

[22] Filed: May 18, 1992

Related U.S. Application Data

[63] Continuation of Ser. No. 540,155, Jun. 19, 1990, abandoned.

[30] Foreign Application Priority Data

Jul. 15, 1989 [DE] Fed. Rep. of Germany ....... 3923533

[51] Int. Cl.$^5$ .............................................. H05K 7/20
[52] U.S. Cl. ................................. 361/386; 361/388; 361/389; 361/400; 361/404; 361/410; 361/412; 165/185; 257/700; 257/786
[58] Field of Search ............... 361/386, 380, 388, 389, 361/396, 398, 400, 402, 403, 404, 410, 412, 414; 357/80, 81, 71; 165/185

[56] References Cited

U.S. PATENT DOCUMENTS

| | | | |
|---|---|---|---|
| 4,698,729 | 10/1987 | Riesner et al. | |
| 4,750,089 | 6/1988 | Derryberry et al. | 361/388 |
| 4,882,657 | 11/1989 | Braun | 361/412 |
| 4,967,314 | 10/1990 | Higgins | 361/414 |

FOREIGN PATENT DOCUMENTS

| | | |
|---|---|---|
| 0220508 | 5/1987 | European Pat. Off. . |
| 0272046 | 6/1988 | European Pat. Off. . |
| 8701510 | 3/1987 | PCT Int'l Appl. . |

*Primary Examiner*—Leo P. Picard
*Assistant Examiner*—Young S. Whang
*Attorney, Agent, or Firm*—Scully, Scott, Murphy & Presser

[57] ABSTRACT

Arrangement of a multi-layer through-contacting integrated circuit board with bonding-wires extending between chip contacts and substrate contacts, particularly designed for a compact circuit assembly of signal processors in an airborne body. The substrate contacts are arranged within a narrow connector strip extending parallel to the boundary of a chip-mounting region, and are in the plane of the substrate surface at approximately the same measurement and geometric sequence as the chip contacts of the circuit. Thin conductive paths extend and spread apart in a fan-like manner from the substrate contacts in an edge strip of the chip-mounting region, and terminate at mutually offset end surfaces of through-holes or vias which have a substantially larger cross-sectional area than the width of the thin conductive paths.

4 Claims, 1 Drawing Sheet

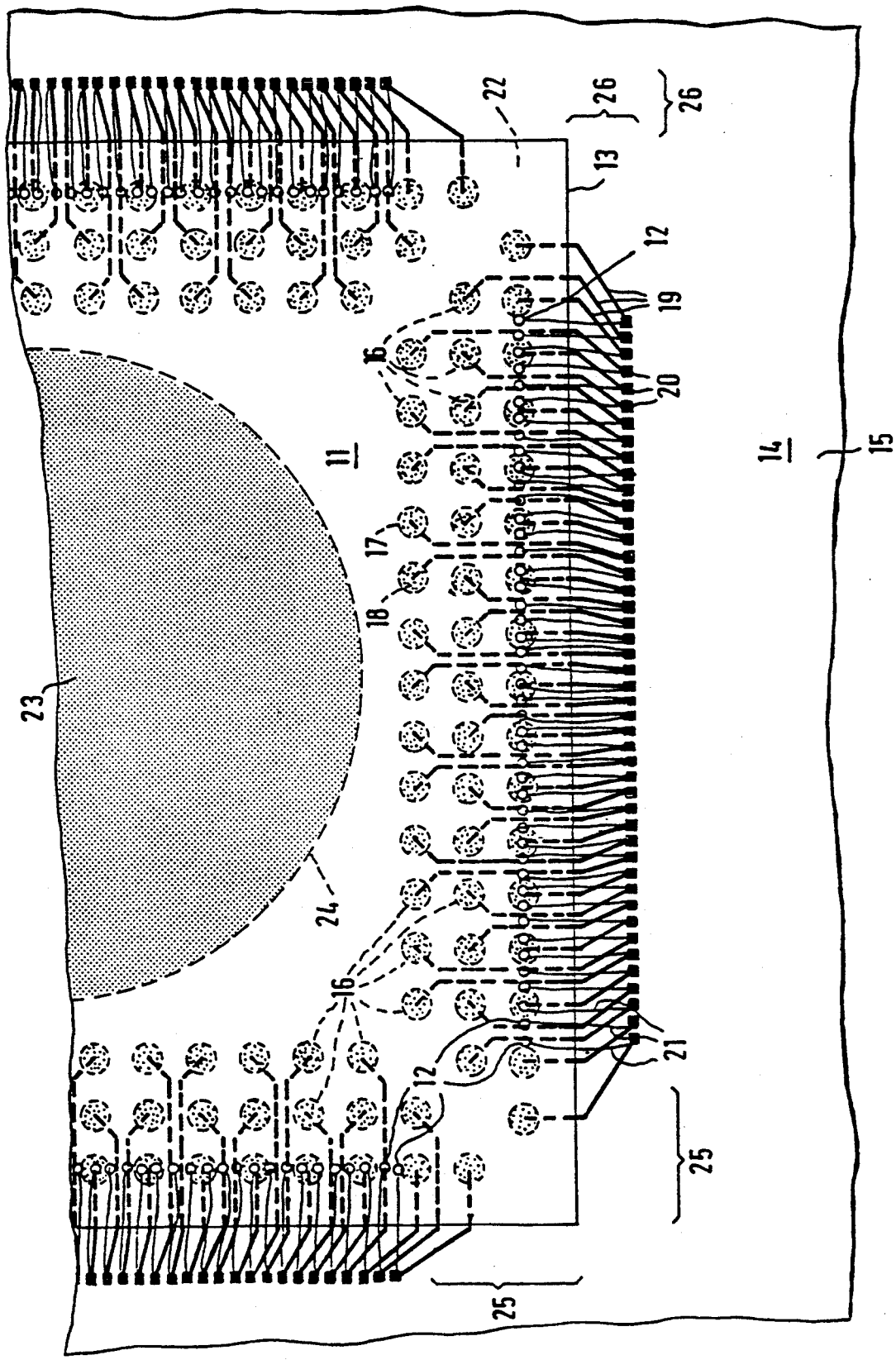

ARRANGEMENT OF AN INTEGRATED CIRCUIT ON A CIRCUIT BOARD

This is a continuation of copending application(s) Ser. No. 540,155 filed on Jun. 19, 1990, now abandoned.

BACKGROUND OF THE INVENTION

1. Field of the Invention

The present invention relates to the arrangement of an integrated circuit on a multi-layer through contacting circuit board with bonding-wires extending between chip connectors and substrate connectors or terminals; especially for a compact circuit assembly of signal processors utilized in airborne bodies, generally as disclosed in U.S. Pat. No. 4,698,729, which is commonly assigned to the assignee of the present application.

2. Discussion of the Prior Art

An arrangement of that type is essentially known from the disclosure of European Laid-Open Patent Appln. 0 272 046 or from PCT-Publication WO 87/01510. The circuit board which is constructed in multi-layers and which is selectively contacted between the planes of the conductive paths thereof through the intermediary of electrically-conductive through-holes or vias; such as are disclosed in European Laid-Open Patent Appln. 0 220 508; possesses a depression with recessed sidewalls in the chip mounting region, wherein the steps formed by the recessed sidewalls are given by the different substrate planes of the circuit board and are equipped with contacts or terminals for the bonding-connections with the circuit terminals. Because of this staggering transversely of the boundaries of the circuits, a larger number of substrate contacts can be arranged along the boundary than in contrast with a narrow strip extending along the boundary of the circuit. In providing for the broad staggering, it is advantageous that the substrate contacts or terminals can be designed to be so large in their cross-sectional surface area, as to be able to concurrently serve as end surface regions for the associated through-holes or vias in the sandwich-plane of the circuit board which is desired for to the particular technological circuitry. However, disadvantageous is not only the requirement for a large space extending about the circuit, which essentially prohibits a close arrangement of circuits on the circuit board; above all, it is disadvantageous that for the placement of the bonding-wires from the contact plane of the circuit into planes on the circuit board which are offset with regard thereto, there cannot be utilized the commonly employed bonding devices, and that due to the path of the relatively large arches at small side spacings for the bonding-wires which bridge thereover, this results in an increased danger of short-circuiting. Basically, in view of the foregoing, it is intended to arrange the substrate contacts or terminals all in one plane, and always closely adjacent the circuit contacts, such as is known from the usual chip-bonding technology for small or miniature circuits. However, for high-integrated large circuits, such a large number of bonding-contacts are provided along their boundaries, that the geometrically associated and closely adjoining substrate contacts cannot be constructed large enough for the formation of the wiring-accommodating through-hole or via into the interior of the layered circuit board.

SUMMARY OF THE INVENTION

In recognition of these prevailing conditions, it is an object of the present invention to provide an arrangement of the type considered herein, which on the one hand, facilitates the utilization of a short bonding-wire connection, and on the other hand, allows for the realization of through-holes or vias of the largest cross-sectional areas, as well as for a close packing of circuits on the circuit board.

The foregoing object is inventively attained through an arrangement of the type which is under consideration herein, whereby within a narrow connector strip extending in parallel with the edging or boundary of the chip-mounting region, there are arranged the substrate contacts in the plane of the substrate surface, at approximately the same measurement and geometric sequence of the chip contact on the circuit, extending on the thin conductive paths from the substrate contacts in an edge strip of the chip-mounting region below the circuit and fanning out from there, terminating at mutually offset end surfaces of through-holes or vias which possess a substantially larger cross-sectional area in contrast with the width of the conductive paths.

Pursuant to the present object, the narrow strip for the arrangement of the substrate contacts possesses only the surface requirement for the circuit contacts and, as a result thereof, can be arranged directly in parallel with these externally of the chip edging region or boundary on the surface of the circuit board. The substrate contacts in this uppermost plane are connected, by means of the conductive paths, with the end surfaces of the through-holes or vias which, besides the circuit do not necessitate the provision of any room on the circuit board, inasmuch as they are positioned within a relatively wide edge strip of the chip-mounting region beneath the circuit. At that location, they can be constructed in an optimized cross-sectional measurement and mutual orientation and equipped with a conductive core, which additionally assumes a heat-dissipating function in addition to its electrical connecting function.

Preferably, the sandwich-constructed circuit board is produced from a stack of ceramic sheets which, in the unbaked condition thereof, are generally paper-like, which are imprinted with patterns of conductive paths in conformance with the requirements of the circuitry technology, after the vias or through-holes which are to be later on axially aligned, are inserted therein and filled with a core material. The mechanically stiff circuit board consisting of ceramic is obtained when the compressed stack is baked and sintered. Through the application of this heat treatment, the ceramic substrate becomes not only hermetically sealed (due to its high component of glass), but the initially not yet electrically conductive thick-layer conductive path structure also becomes electrically conductive on the individual planes.

For the individual substrate thicknesses there is advantageously made use of a material which is commercially sold under the tradename GREEN TAPE by the DuPont Corporation. For the effectuation of the connector-conductive paths, intermediate the substrate contacts and the surfaces at the ends of the through-holes or vias, there can be vapor-deposited a film structure in accordance with the fine-conductor technique, such as is known as the high-energetic explosion coating DYBO by Schering AG. However, other types of fine-structure methods can also be employed, generally such as the additive application of chemical copper as supplied by the Schering AG, or the gold powder immersion nucleating known as the DuPont PCS-process. In contrast with the usual thin-film technique, these relatively heavy-layered processes for the formation of the fine conductive paths evidence the advantage that higher currents can flow through the narrow conductor cross-sections; and moreover, these thicker structures are less sensitive to fine-fissure formation caused by mechanical strains or stresses. The shrinkage of the conductive paths-illuminating pattern encountered during the sintering process is; in essence, anisotropic across the material, but is quantitatively known, so that there can be implemented a compensation through a correspondingly distorted geometer during the application of the illuminating-conductive paths prior to the sintering process. This is also valid for the positioning of the through-holes or vias in order to avoid the bores in the individual substrate layers from evidencing such a kind of offset with respect to each other as to preclude the presence of a through-extending conductor core during the stacking of the filled bores or vias.

BRIEF DESCRIPTION OF THE DRAWINGS

Additional alternatives and modifications, as well as further features and advantages of the invention can now be more readily ascertained from the following detailed description thereof, illustrated in a generally diagrammatic manner in the single FIGURE of the accompanying drawing, showing in a fragmentary representation, a plan view of a multi-layer circuit board with an integrated circuit mounted thereon.

DETAILED DESCRIPTION

With regard to the extensively enlarged scale-drawn and fragmentarily represented integrated circuit 11 (IC-Chip) of quadratic structure with bonding-contacts 12 (pads) within a narrow connector strip 26 extending along each of its side edges or bounds 13, the foregoing pertains to a so-called large-scale integrated circuit, which distinguishes itself through a multiplicity of functions of the signal processing technology, and through the thereby required extremely large number of contacts or terminals 12 for the supply of the operating voltage level and the input informations, as well as for the output of the processing informations. The lower or bottom surface of the (not shown in the drawing) is directly fastened in a manner known per se through the intermediary of a good heat conductive adhesive; or if necessary, with the interposition of an electrical insulating layer (below a conductive layer for the rearward potential connection to the circuit 11), within a specified mounting region 22 (die pad), on the surface 14 of a multi-layered circuit board 15 (substrate). This circuit board includes conductive path structures on its individual, superimposingly assembled board thickness for the connection of specified chip contacts 12 with each other and with the contacts of further circuits suitably arranged on the circuit board or substrate 15. The cross-connecting between the individual conductive path-planes within the interior of the multi-layered circuit board 15 is carried out by means of so-called through-holes 16 (vias) in the multi-layered circuit board 15, shown in phantom in the Figure as they are below the IC chip 11; in essence, by means of bores 17, which possess a core 18 constituted of an electrically-conductive material for the through-contacting.

The end surface regions of the through-holes or vias 16 which reach the surface 14 of the substrate are electrically-conductively connected with the substrate contacts 20 (bonding pads) located on the substrate surface 14. The substrate contacts 20 are arranged in a pattern within a narrow strip 26 extending in parallel with the circuit edging or boundaries 13 externally of the circuit surface, which is geometrically at least similar to the pattern in the arrangement of the chip contacts 12, preferably through the same lines of sequence and dense stacking in coincidence therewith (for example, in the drawing shown by the geometric association of the quadratically represented substrate contacts 20 with the chip contacts 12 which are represented as small rings). The electrical connection between the presently geometrically associated chip and substrate contacts 12-20 is carried out in a manner which is known per se; for instance through bonding-wires 21, or through an automatic tape-bonding procedure.

In order to be able to accommodate the functionally-required large number of contacts or terminals 12 (and correspondingly 20) along a circuit edge or boundary 13, the dimensions in the widths of the contacts 12, 20 cannot be constructed to be substantially wider than the adjacently extending conductive paths 19 on the substrate surface 14. The conducting paths 19 are formed on the surface 14 of circuit board 15, and extend under the IC chip 11 to the vias 16, as indicated by the phantom portions thereof in the Figure. In actual practice, the contact dimensions are selected so small in size that; for example, an automatic positioning of the bonding-wires 21 can just still take place with commercially-available bond devices. These cross-sectional dimensions; however, are too small for the formation of the through-holes or vias 16. This is an aspect that because of technological reasons, the bores 17 which are introduced or formed the individual thicknesses or layers of the circuit board 15 prior to the sandwich-completion thereof, cannot possess a suitably small diameter, such that the not completely avoidable mutual offset of the individual sandwich-thicknesses or layers does not lead to an interruption of the through-contacting core 18; in essence, to a contacting with the closely approaching but not applicable neighboring conductive paths in the respective substrate plane. Were one to increase the substrate contacts 20 themselves to such a size in cross-section, such that they concurrently permit the inclusion of the end surfaces of the through-holes or vias 16, then the pattern for the chip contacts 12 could not be maintained; inasmuch as, because of the increase in the diameter, the length of a chip boundary 13 would not be adequate to facilitate the arrangement of all vias 16 in a single line adjacent to each other. Consequently, the vias 16 would then also have to be staggered transversely of the chip boundary or edge 13; in effect, within a wider strip fanned out in two directions on the substrate surface 14. However; on the one hand, this would stand in the way of a densely adjacent arrangement of circuits 11 on the circuit board 15, inasmuch as the wider connector strip extending about a circuit 11 would be required for the vias 16 which are arranged fanned out; whereas, on the other hand, it would be disadvantageous that vias-substrate contacts which are located more remotely from the circuit boundary 13, would require lengthier bonding-wires extending to the associated chip contacts 12, which because of the use of extremely thin wires, would create problems from the standpoint of the manufacturing technology and with respect to the mechanical capacity to withstand stresses. Instead thereof, the fanning out of the cross-sectionally relatively large-surfaced vias 16 is repositioned (in effect, within one strip 25 along the boundary 13, but) below the mounting region 22 for the circuit 11 on the substrate surface 14. From there, the conductive paths 19 lead to a dense sequence of (associated with the chip contacts 12) substrate contacts 20, such that the requirement in surface area for the connector strips 26 lies therein only still within the magnitude in size for the surface for the chip contacts 12, as can be readily ascertained from the drawing. Contrastingly, in the mounting region 22 there is available space; in effect, beneath the circuit 11, in order to optimize the size and mutual arrangement of the vias 16 in view of the technological requirements encountered during the production of the layered circuit board 15; in essence, to distribute the end surfaces of the vias, which in contrast with the narrow conductive paths 19 are much larger in cross-section, along the wider edge strip 25.

Thusly, a wider edge strip 25 of the mounting region 22 (along the circuit boundary 13) is hereby covered by the arrangement of the through-holes or vias 16 and their conductive paths 19. However, there always still remains an open space in the center 23 of the mounting region 22 for the arrangement of a heat sink in the shape of a heat-dissipating post 24 which, in a known manner, will dissipate or conduct away the heat generated by energy losses encountered during the operation of the circuit 11, out of the plane of the mounting region 22 into the interior of the circuit board 15, and therein transmit this heat; for example, to the large-surfaced conductive path regions. In contrast therewith, in the edge strip 25 the problem with regard to heat dissipation is not as great, inasmuch as herein the atmosphere of the surroundings will act in a larger-surfaced manner across the edge of the circuit. For the remainder, there is encountered at that location an additional discharge of heat to the interior of the circuit board 15 through the relatively dense sequence in the via cores, consisting of electrically and thermally good conductive material, which extend into different substrate depths 18.

The narrow connector strip 26 extending along the circuit boundary 13 which is now only required outside of the chip mounting surface 22 for the substrate contacts 20 and for the adjoining ends of their conductive paths 19, is coverable by a correspondingly narrow frame subsequent to the formation of the bonding-connections 21, besides which there can be directly attached such a connector strip for a circuit which is to be adjacently mounted on the surface 14 of the circuit board.

What is claimed:

1. An arrangement of an integrated circuit chip on a multi-layered through-contacting circuit board substrate, including bonding-wires extending between chip contacts and substrate contacts, said substrate contacts being located within a narrow connector strip extending in parallel with the boundary of an integrated circuit chip mounting region on said circuit board substrate in approximately the same measurements and geometric sequence as the chip contacts are located on the circuit board substrate in a plane of a surface of the substrate, and thin conductive paths extending in said plane from the substrate contrast within san edge strip of the IC chip mounting region, said thin conductive paths extending and spreading apart in a fan-like manner from the substrate contacts to terminations of the thin conductive paths at end surfaces of vias in said circuit board substrate which have a substantially larger cross-sectional dimension than the width of the thin conductive paths, and larger cross-sectional vias being formed as a two dimensional array of vias in said circuit board substrate which are spaced apart in a relatively large two dimensional strip area located blow the integrated circuit chip.

2. An arrangement as claimed in claim 1, wherein the vias comprise bores in the individual layers of the circuit board substrate and electrically and thermally-conductive cores in said bores.

3. An arrangement as claimed in claim 1, wherein the conductive paths are formed on the uppermost layer of a stack of ceramic laminates pursuant to the heavy-layer technique.

4. An arrangement as claimed in claim 1, wherein the narrow connector strips in conjunction with bonding wires leading to the substrate contacts are covered externally of circuit boundaries by a narrow frame.

* * * * *